United States Patent [19]
Konishi

[11] Patent Number: 5,023,890
[45] Date of Patent: Jun. 11, 1991

[54] DIGITAL PEAK NOISE REDUCTION CIRCUIT

[75] Inventor: Kazuo Konishi, Kanagawa, Japan

[73] Assignee: Kabushiki Kaisha Toshiba, Kanagawa, Japan

[21] Appl. No.: 330,037

[22] Filed: Mar. 29, 1989

[30] Foreign Application Priority Data

Mar. 31, 1988 [JP] Japan ................................. 63-78772

[51] Int. Cl.$^5$ ...................... H03K 21/00; G06F 7/50; G06F 7/52
[52] U.S. Cl. .................................. 375/34; 375/99; 364/761; 364/765; 377/47
[58] Field of Search .................. 375/99, 103, 104, 34; 381/106, 94, 98, 101, 46, 47; 333/14; 370/7; 364/761, 765; 377/47, 64, 110, 118; 360/39, 43

[56] References Cited

U.S. PATENT DOCUMENTS

| | | | |
|---|---|---|---|
| 4,250,470 | 2/1981 | Szarvas | 333/14 |
| 4,461,025 | 7/1984 | Franklin | 381/94 |
| 4,573,178 | 2/1986 | Morito | 377/47 |
| 4,701,953 | 10/1987 | White | 381/46 |
| 4,707,798 | 11/1987 | Nakano | 364/765 |
| 4,718,032 | 1/1988 | Irukulla et al. | 364/761 |
| 4,785,412 | 11/1988 | Tran | 364/761 |
| 4,941,118 | 7/1990 | Yamazaki et al. | 364/761 |
| 4,949,295 | 8/1990 | Stearns | 364/761 |

OTHER PUBLICATIONS

Japanese Patent Disclosure (Kokai) No. 60-123931, K. Kawiwagi, Jul. 2, 1989.
"Digital Signal Processing System", Chap. 1, Sec. 3.3 Division To Kai Daigaku Syuppankai.

Primary Examiner—Benedict V. Safourek
Assistant Examiner—Young T. Tse
Attorney, Agent, or Firm—Finnegan, Henderson, Farabow, Garrett and Dunner

[57] ABSTRACT

A digital peak noise reduction circuit for reducing peak noise of an input digital signal having variable levels corresponding to a predetermined sound volume range. The circuit includes a division circuit for dividing the level of the input signal; a ROM for supplying a plurality of data expansion rates, each expansion rate being defined by a relationship between a different specific range of input digital signal level and the predetermined range; a multiplier for multiplying the digital audio data with the reciprocal related data output from the ROM; a multi-stage shift circuit for supplying a plurality of data compression rates, (each compression rate correspond to the expansion rates of the ROM) and for producing an output signal having a level corresponding to the selected compression rate; a de-emphasis circuit for compensating for specified frequency characteristics of the output signal; and a feedback circuit for supplying the output signal to the division circuit for controlling the ROM.

10 Claims, 5 Drawing Sheets

DIGITAL PEAK NOISE REDUCTION CIRCUIT

FIELD OF THE INVENTION

The present invention relates generally to a digital peak noise reduction circuit for a video tape recorder, and more particularly, to a division circuit suitable for a digital peak noise reduction circuit.

BACKGROUND OF THE INVENTION

In a video tape recorder, a peak noise reduction circuit has been used for recording audio signals. The audio signals are recorded on a sound track of video tape after an FM modulation. Such a peak noise reduction circuit is used for expanding the dynamic range of the recorded signals through the FM modulation. For example, the dynamic range of recorded audio signals can be expanded to about a range of 90 dB suitable for a high-fidelity sound reproduction.

FIG. 1 shows an example of a typical peak noise reduction circuit for a video tape recorder. In FIG. 1, an input terminal 11 is provided for receiving an audio input signal to be recorded on a video tape. The audio input signal is applied to a division circuit 12. The division circuit 12 divides the audio input signal by a feedback signal, as described later. The divided signal obtained by the division circuit 12 is introduced to an output terminal 14 though a de-emphasis circuit 13. The output signal output from the de-emphasis circuit 13 is fed back to the division circuit 12 as the feedback signal through a waiting circuit 15 and a detection circuit 16.

The peak noise reduction circuit compresses the audio input signal to a half level in decibels (dB), as shown in FIG. 2. FIG. 2 shows the level compression characteristics of the peak noise reduction circuit. As shown in FIG. 2, an input level of the audio input signal is exponentially compressed. For example, an audio input signal input level of −6 dB is compressed to an output level of −3 dB.

The typical peak noise reduction circuit, as shown in FIG. 1, is constructed as an analog circuit. Recently, however, peak noise reduction circuits has been constructed as digital circuits. In a conventional digital peak noise reduction circuit, the de-emphasis circuit 13, the waiting circuit 15 and the detection circuit 16 of FIG. 1 can be constructed by conventional IIR (Infinite Impulse Response) filters. Further, the division circuit 12 of FIG. 1 has been conventionally constructed with digital circuits, as shown in FIG. 3.

In FIG. 3, first and second terminals 17 and 19 are provided for receiving a digital divisor Na and a digital dividend Nb, respectively. The divisor Na and the dividend Nb are supplied from the input terminal 11 and the detection circuit 16 of FIG. 1. The dividend Nb is applied to a multiplier 20. The divisor Na is applied to the multiplier 20 through an ROM (Read Only Memory) 18. The ROM 18 changes the divisor Na to data Nc relating to a reciprocal of the divisor Na. That is, the divisor Na is applied to the ROM 18 as address data so that the ROM 18 outputs a prescribed reciprocal data corresponding to the divisor Na supplied thereto as the address.

Data stored in the ROM 18 are multiplied into twice the real reciprocals of the divisors. Thus, the prescribed reciprocal data Nc multiplied by two is read out from the ROM 18 in response to the address data or the divisor Na supplied from the first input terminal 17. Such a multiplied reciprocal data Nc will be referred to as a modified reciprocal, hereinafter. The modified reciprocal Nc corresponds directly to the divisor Na supplied from the first input terminal 17.

The modified reciprocal Nc output from the ROM 18 is applied to the multiplier 20. The multiplier 20 multiplies the dividend Nb supplied from the second input terminal 19 with the modified reciprocal Nc. The result of multiplication Nd between the dividend Nb and the modified reciprocal Nc is applied to a shifter 21. The shifter 21 shifts the multiplication result Nd output from the multiplier 20 by a prescribed amount. In other words, the shifter 21 multiplies the multiplication result Nd by a prescribed fixed amount.

It is assumed that the dividend Nb and the divisor Na are digital signals of 16 bits and 8 bits, respectively. Accordingly, the divisor, i.e., the address Na of the ROM 18 and the modified reciprocal Nc corresponding to the address Na are represented as binary data from [0] to [255]. If the address Na is [128], the ROM 18 outputs a binary data [2] as the modified reciprocal Nc of the address Na, [128].

Here, the real reciprocal of the binary data [128] is [1/128]. The real reciprocal [1/128] can be obtained as follows. The modified reciprocal Nc with the binary data [2] is applied to the multiplier 20. The multiplier 20 multiplies the dividend Nb supplied from the second input terminal 19 by the modified reciprocal Nc, i.e., the binary data [2]. The dividend Nb is converted to a multiplication resultant Nd, i.e., a binary data of Nb×[2]. The multiplication resultant Nd is applied to the shifter 21. The shifter 21 shifts the multiplication resultant Nd by a prescribed amount. In other words, the shifter 21 further multiplies the multiplication resultant Nd by a prescribed amount.

For example, if the amount of shift operation carried out by the shifter 21 is set to [1/256], the shifter 21 further multiplies the multiplication resultant Nd by the amount of shift [1/256]. As a result, division data Ne represented as follows is obtained from the shifter 21.

$$Ne = Nb \times [2] \times [1/256] = Nb \times [2/256]$$
$$= Nb \times [1/128]$$

The division data Ne is applied to the de-emphasis circuit 13, as shown in FIG. 1, through an output terminal 22 of the division circuit of FIG. 2. The division data Ne corresponds to a quotient between the dividend Nb and the divisor Na with the binary data [128].

The dividend Nb and the divisor Na are binary data with 16 bits and 8 bits, respectively, as described above. Thus, the multiplication resultant Nd obtained by the series circuit of the multiplier 20 and the shifter 21 is converted to 10 bit binary data.

FIG. 4 shows the conversion characteristics of the ROM 18 for outputting the modified reciprocal Nc. As shown in FIG. 4, the divisors Na such as [255], [128], [64], [32], . . . are converted to the corresponding modified reciprocals Nc [1], [2], [4], [8], . . . The modified reciprocals Nc [1], [2], [4], [8]. . . are applied to the multiplier 20. Then, the quotients, i.e., the multiplication resultants Nd such as Nb×[1/255], Nb×[1/128], Nb×[1/64], Nb×[1/32]. . . are obtained from the output terminal 22.

The conventional division circuit suitable for peak noise reduction circuits has a drawback as described below. That is, the ROM has a variable resolution for changing the divisor Na to the modified reciprocal Nc. For example, the modified reciprocal Nc varies in a range between [255] and [128] in response to the change of the divisor Na between a range between [1] and [2]. In the range of the divisor change between [1] and [2], the ROM 18 has a relatively high resolution [128] ([255]→[128]) for modified reciprocal Nc. The resolution of the ROM 18 decreases to [64] ([128]→[64]), in the range of the divisor change between [2] and [4]. Thus, the resolution of the ROM 18 abruptly decreases in the order of [32], [16], [8], [4], [2], [1], in response to the increase of the divisor Na in the order of [8], [16], [32], [64], [128], [256].

The conversion characteristics of the ROM 18 influence the compression characteristics of the digital peak noise reduction circuit. If it is assumed that filters constituting the de-emphasis circuit 13, the waiting circuit 15 and the detection circuit 16 of FIG. 1 commonly have a gain [1], the digital peak noise reduction circuit has a compression characteristic, as shown in FIG. 5. As shown in FIG. 5, the resolution of the digital peak noise reduction circuit abruptly drops with increases in the level of the digital input signal.

SUMMARY OF THE INVENTION

It is an object of the present invention to provide a digital peak noise reduction circuit which has stable high resolution signal compression characteristics for all values of input signal to be compressed.

Another object of the present invention is to provide a division circuit suitable for a digital peak noise reduction circuit.

In order to achieve the above object, a digital peak noise reduction circuit according to one aspect of the present invention includes a division circuit for dividing the level of the input digital signal which has an ROM for supplying a plurality of data expansion rates, each expansion rate being defined by a relationship between a different specific range of input digital signal level and the predetermined range, a multiplier for multiplying the digital audio data with the reciprocal related data output from the ROM and a multi-stage shift circuit for supplying a plurality of data compression rates, each compression rate corresponding to the expansion rates of the ROM and for producing an output signal having a level corresponding to the selected compression rate, a de-emphasis circuit for compensating for specified fequency characteristics of the output signal and a feedback circuit for supplying the output signal to the division circuit for controlling the ROM.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the invention and many of the advantages thereof will be readily obtained as the same becomes better understood by reference to the following detailed description when considered in connection with the accompanying drawings, wherein.

DESCRIPTION OF THE PREFERRED EMBODIMENTS

Figure 1:
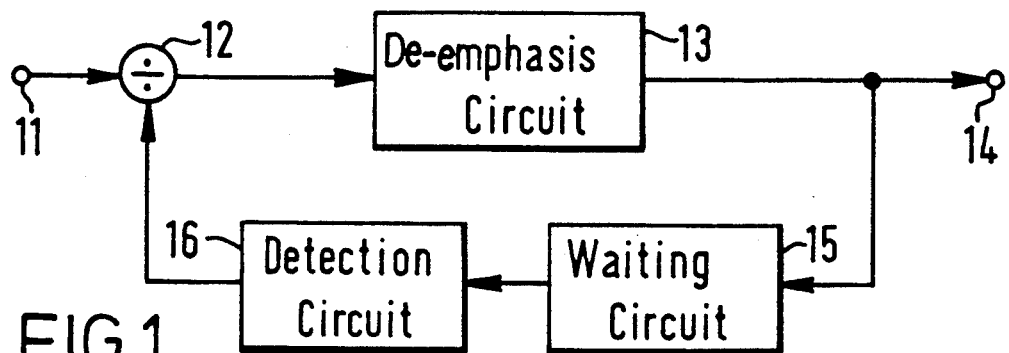
FIG. 1 is a block diagram showing a typical peak noise reduction circuit suitable for video tape recorders.
Figure 2:
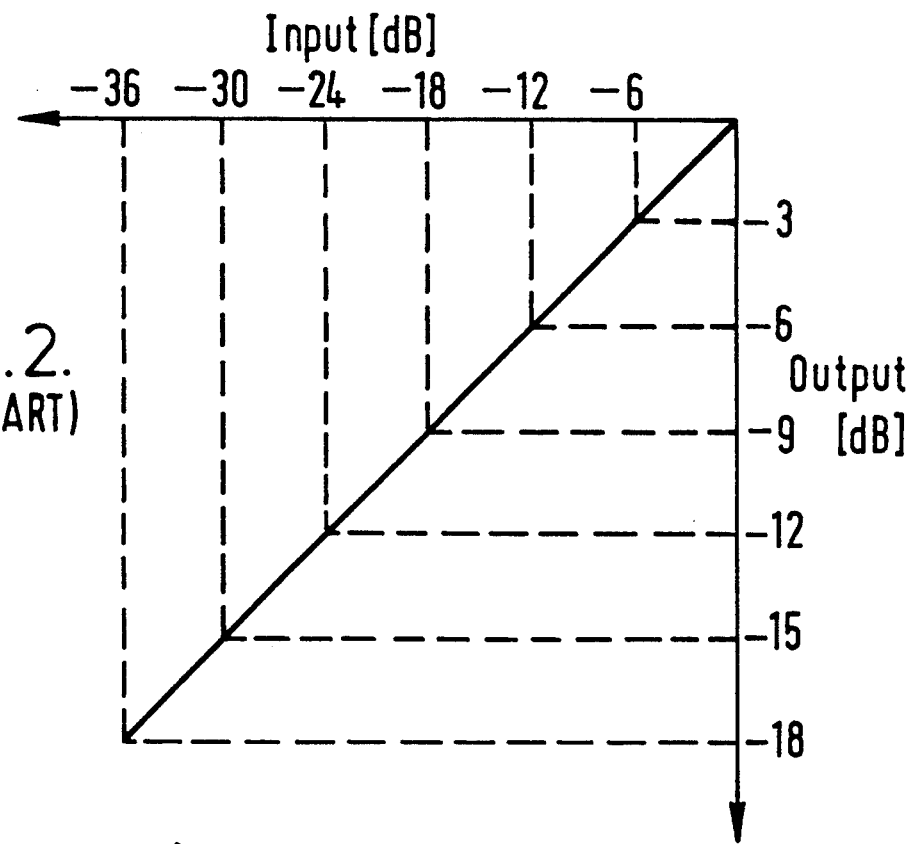
FIG. 2 is a graph showing the level compression characteristics of the peak noise reduction circuit of FIG. 1.
Figure 3:
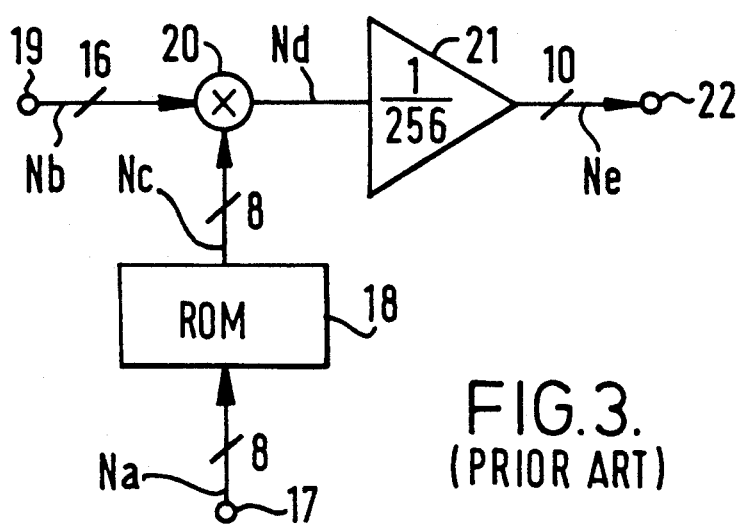
FIG. 3 is a block diagram showing the detail of a conventional division circuit used in the peak noise reduction circuit of FIG. 1.
Figure 4:
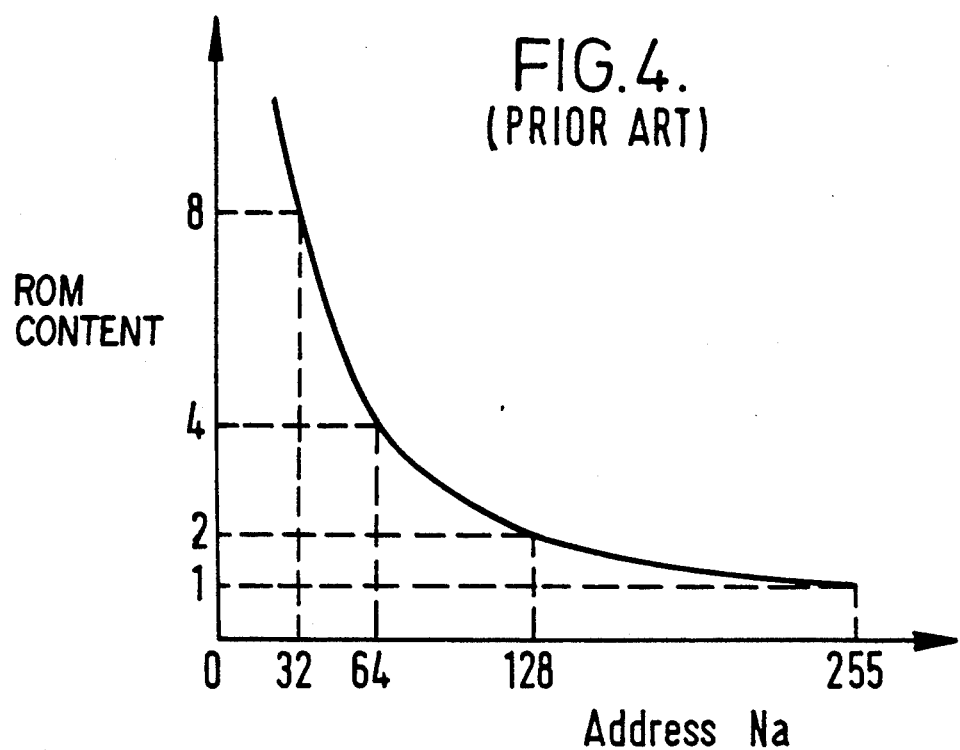
FIG. 4 is a graph showing address to ROM content characteristics of the ROM 18 of FIG. 3.
Figure 5:
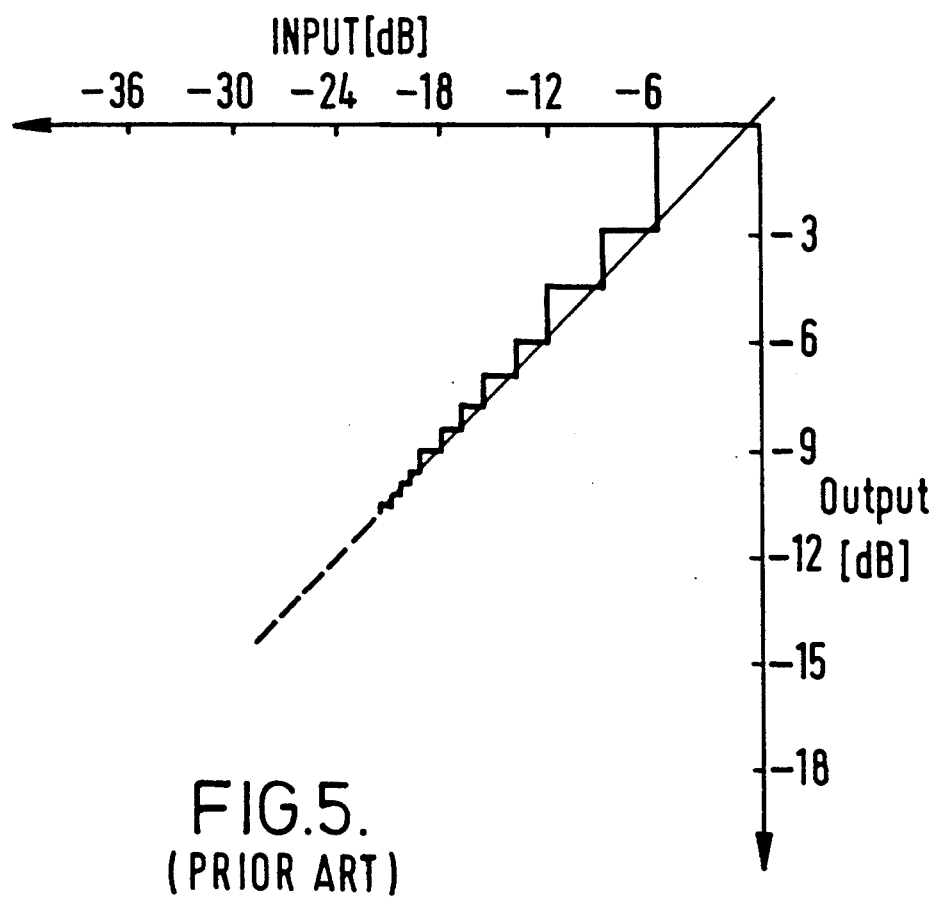
FIG. 5 is a graph showing data compression characteristics of the peak noise reduction circuit of FIG. 1.

The present invention will be described in detail with reference to the FIGS. 6, 7 and 8. Throughout the drawings, reference numerals or letters used in FIGS. 1 through 5 (Prior Art) will be used to designate like or equivalent elements for simplicity of explanation.

The digital peak noise reduction circuit according to the present invention has similar circuit construction as the circuit of FIG. 1, except the construction of the division circuit 12.

Figure 6:
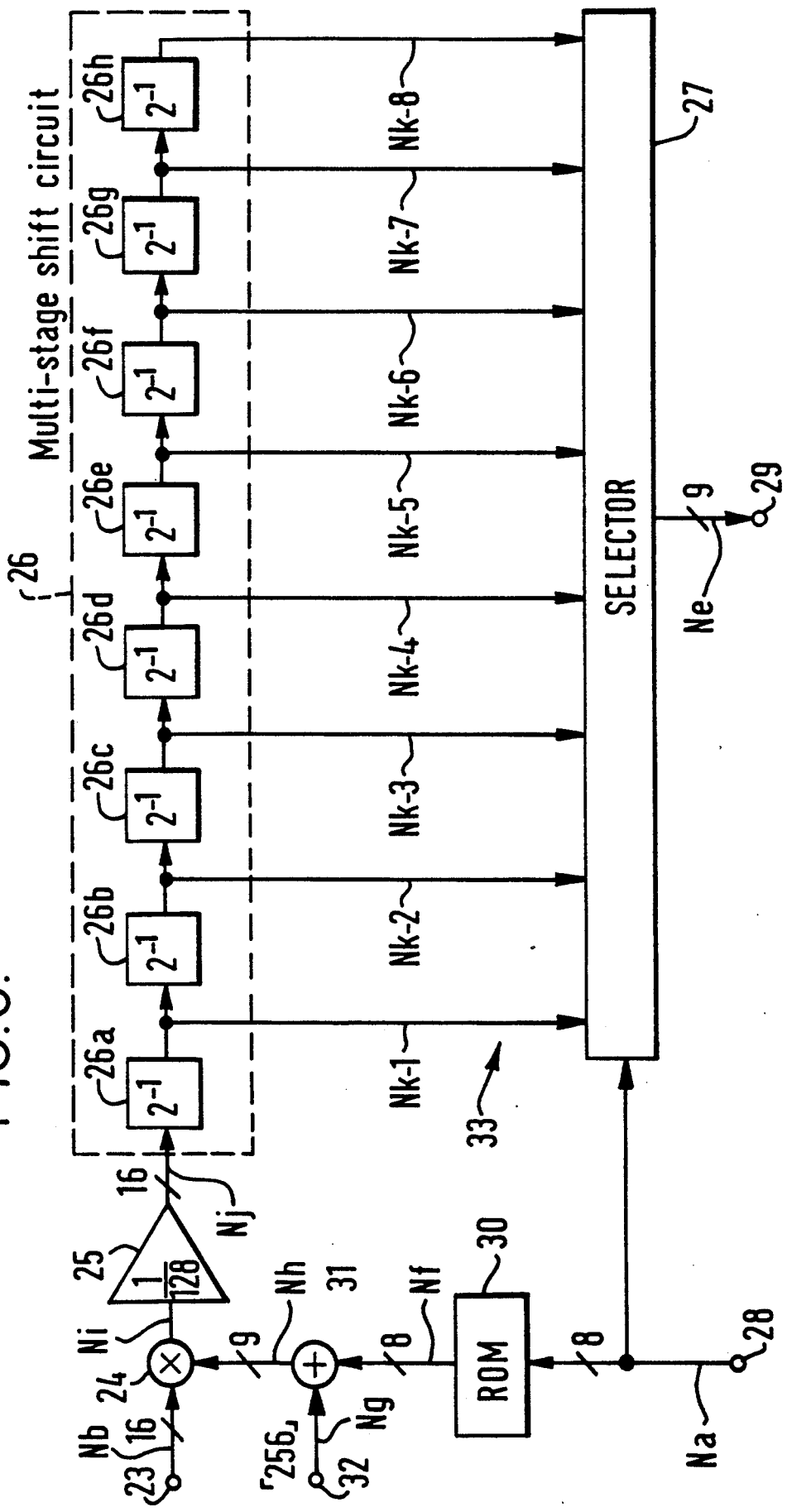
FIG. 6 is a block diagram showing the detail of a division circuit according to the present invention.

Referring now to FIG. 6, an embodiment of the division circuit suitable to the digital peak noise reduction circuit according to the present invention will be described in detail. It is assumed that the embodiment of the division circuit operates to divide a dividend Nb of 16 bits by a divisor Na of 8 bits and a quotient Ne of 9 bits is obtained.

In FIG. 6, first and second input terminals 28 and 23 are provided for receiving the divisor Na and the dividend Nb. The divisor Na and the dividend Nb are supplied from the input terminal 11 and the detection circuit 16 of FIG. 1, respectively. The dividend Nb is applied to a multiplier 24.

The divisor Na is applied to an ROM 30 as an address. The divisor Na will be referred to as an address in explanations corresponding to the ROM 30. The ROM 30 stores a pluarlity of data Nf relating to a reciprocal of the address Na, as described later. The reciprocal related data Nf corresponding to the address Na is read out from the ROM 30. The reciprocal related data Nf also is 8 bit data, since the address Na is 8 bit data, as described above. The 8 bit reciprocal related data Nf output from the ROM 30 is applied to an adder 31.

The adder 31 adds a fixed value Ng of, e.g., [256] to the reciprocal related data Nf. The fixed data Ng of [256] is supplied from a fixed data source (not shown) through a third input terminal 32. The operation carried out in the adder 31 for adding the fixed data Nf of [256] to the reciprocal related data Nf is equivalent to a data conversion for increasing the reciprocal related data Nf by one bit. Thus, another reciprocal related data Nh of 9 bits is obtained. The data Nh has the bit of [1] as its MSB (Most Significant Bit). The data Nh will be referred to as the modified reciprocal hereafter. The modified reciprocal Nh is applied to the multiplier 24.

Contents of the ROM 30, i.e., the reciprocal related data Nf stored in the ROM 30 are illustrated in the following table.

| ADDRESS Na | ROM 30 | | ADDER 31 | SHIFTER 33 |
|---|---|---|---|---|
| | RECIPROCAL | EXPANSION RATE | RECIPROCAL RELATED DATA Nh | COMPRESSION RATE |
| 255-128 | 1/255 -1/128 | 256 | 256-512 | 1/256 |
| 127-64 | 1/127-1/64 | 128 | 256-512 | 1/128 |
| 63-32 | 1/63-1/32 | 64 | 256-512 | 1/64 |
| 31-16 | 1/31-1/16 | 32 | 256-512 | 1/32 |
| 15-8 | 1/15-⅛ | 16 | 256-512 | 1/16 |
| 7-4 | 1/7-¼ | 8 | 256-512 | ⅛ |
| 3-2 | ⅓-½ | 4 | 256-512 | ¼ |
| 1 | 1/1 | 2 | 512 | ½ |

The table shows the reciprocal related data Nf in relation to addresses Na and real reciprocals of the addresses Na. Further, the table shows data obtained by a shifter 33 coupled to the multiplier 24, as described later.

The reciprocal related data Nf stored in the ROM 30 are defined in relation to the addresses Na as follows. The relationship between the address Na and the reciprocal related data Nf will be explained by example.

If an input data at a level of −6 dB is supplied to the second input terminal 23 as the dividend Nb, the level of −6 dB is compressed into half, i.e., the level of −3 dB through the peak noise reduction circuit. The level of −6 dB corresponds to data of [16384] in 16 bit expression. The output level of −3 dB corresponds to data of [180] in 9 bit expression. The output data of [180] is fed back to the first input terminal 28 as it is, since the de-emphasis circuit 13, the waiting circuit 15 and the detection circuit 16 of the peak noise reduction circuit have the gain of 0 dB, as described above. That is, the feedback data of [180] is fed back to the ROM 30 through the first input terminal 28 as the address Na.

A reciprocal of [1/180] is given in response to the address Na of [180]. A fixed data of [255] is added to the reciprocal of [1/180] for converting the reciprocal to 8 bit data. A prescribed expansion data, e.g., [256] is multiplied to the 8 bit reciprocal data for expanding data. Further, a fixed data [256] is subtracted from the expanded data for suppressing the expanded data into 8 bit data. Thus, the reciprocal related data Nf responding to the address Na defined.

Such a definition of the reciprocal related data Nf is given by a following equation.

$$[1/180] \times [255] \times [256] - [256] \approx [107]$$

Thus, the reciprocal related data Nf of [107] is defined in response to the address of [180]. The reciprocal related data of [107] is stored in [180] address portion of the ROM 30.

The value of the address Na of 8 bits falls in a range from [255] to [0]. The address range is divided into eight sections, as shown in the table. The expansion data are different by the eight address sections of the address Na. The expansion data are also illustrated in the table. For example, the expansion data is [256] for the address section; [255]—[128].

Figure 7:
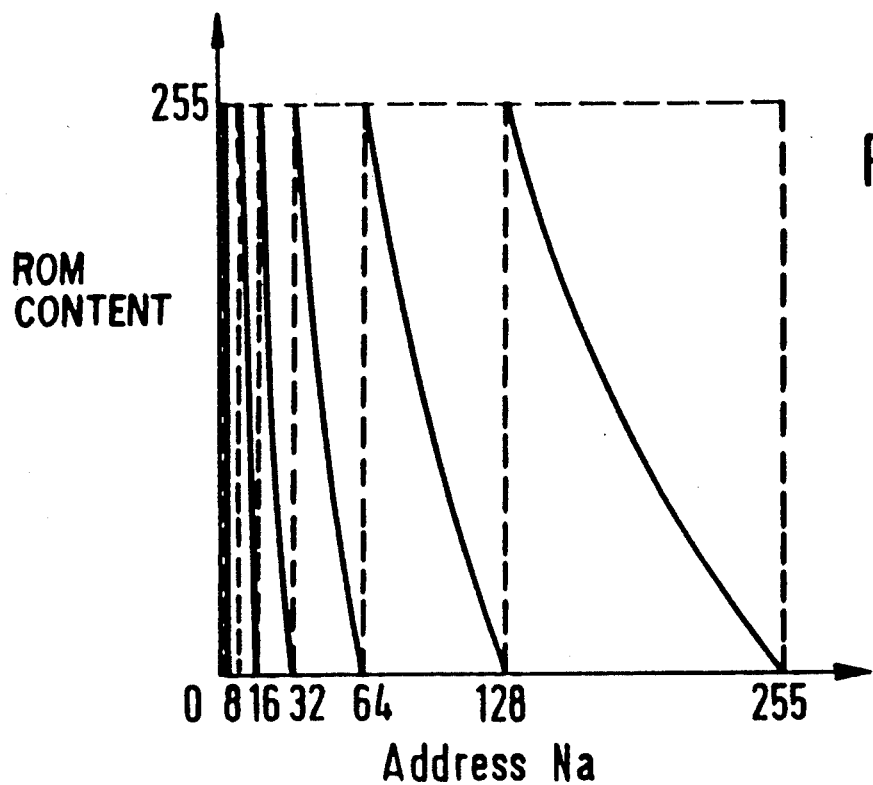
FIG. 7 is a graph showing address to ROM content characteristics of the ROM 30 of FIG. 6.

The relationship between the address Na and corresponding ROM content, i.e., the reciprocal related data Nf stored in the ROM 30 is also shown in FIG. 7. As shown in FIG. 7, the ROM content has the same data range of [0]-[255] for each of the address sections of the address Na. For example, the data range of the ROM content corresponding to the address section of [255]—[128] of the address Na is widely expanded to the same range of [0]-[255]. In the conventional division circuit, however, the data range of the ROM content corresponding to the address section of [255]—[128] of the address Na is limited to the narrow range of [1]-[2], as described before.

The reciprocal related data Nf of [107] is read out from the ROM 30 is response to the address Na of [180]. The reciprocal related data Nf of [107] is applied to the adder 31. The adder 31 adds the fixed value Ng of [256] to the reciprocal related data Nf of [107], as given by the equation.:

$$[107] + [256] = [363]$$

The data [363] is obtained as the 9 bit data Nh. The 9 bit data Nh of [363] is applied to the multiplier 24. The multiplier 24 carries out a following calculation for the dividend Nb of [16384] and the 9 bit data Nh of [363].

$$[16384] \times [363] = [5947392]$$

The multiplication result Ni of [5947392] is applied to the shifter 33.

The shifter 33 compresses the multiplication result Ni for compensating the data expansion carried out in defining the reciprocal related data Nf. The shifter 33 comprises a constant shifter 25, a multi-stage shifter 26 and a selector 27. The constant shifter 25 shifts the multiplication result Ni by a prescribed amount, e.g., [1/128]. Such a data shift is equivalent to multiplication. Thus, the following calculation is carried out by the constant shifter 25.

$$[5947392] \times [1/128] = [46464]$$

The constant shift data Nj is applied to the multi-stage shifter 26.

The multi-stage shifter 26 includes eight stages of shifting units 26a through 26h, each having a shift data of [½] or [2−1]. These shifting units 26a through 26h are coupled in series in order. Thus, each of the shifting units 26a through 26h shifts their input data by [2−1], respectively. That is, each of the shifting units 26a through 26h multiplies their input data by [2−1].

Output terminals of the shifting units 26a through 26h are parallelly coupled to first through eighth input terminals of the selector 29. Thus, for example, the first stage shifting unit 26a supplies a first shift data Nk−1 to the first input terminal of the selector 27. The first shift data Nk−1 is given as follows.

$$Nk-1 = Nj \times [2-1] = [½] \times Nj$$

The second stage shifting unit 26b supplies a second shift data Nk−2 to the second input terminal of the selector 27. The eighth shift data Nk−2 is given as follows:

$$Nk-2 = Nj \times [2^{-2}] = [\tfrac{1}{4}] \times Nj$$

Similarly, other order shift data Nk−3 through Nk−8 are given as follows.

$$Nk-3 = Nj \times [2^{-3}] = [\tfrac{1}{8}] \times Nj$$

$$Nk-4 = Nj \times [2^{-4}] = [1/16] \times Nj$$

$$Nk-5 = Nj \times [2^{-5}] = [1/32] \times Nj$$

$$Nk-6 = Nj \times [2^{-6}] = [1/64] \times Nj$$

$$Nk-7 = Nj \times [2^{-7}] = [1/128] \times Nj$$

$$Nk-8 = Nj \times [2^{-8}] = [1/256] \times Nj$$

A control terminal of the selector 27 is coupled to the first input terminal 28 of the division circuit for receiving the divisor Na. Thus, the selector 27 selects one of the shift data Nk−1 through Nk−8 in accordance with the level range of the divisor Na. A selected data is applied to an output terminal 29 of the division circuit. For example, if the divisor Na, i.e., the address Na is in the address range of [255]-[128], the eight shift data Nk−8 is obtained from the output terminal 29.

The reciprocal related data Nf output from the ROM 30 is expanded by [256], when the address Na is in the address range of [255]-[128]. In this condition, the constant shift data Nj is multiplied by [1/256], as described above. That is, the data expanded by the expansion rate of [256] is compressed by the compression rate of [1/256]. Similar data compressions by different compression rates are also carried out for the data expanded by other expansion rates. Thus, the data expansion for the reciprocal related data Nf stored in the ROM 30 is compensated by the shifter 33.

Referring again to the input data at the level of −6 dB, the eighth shift data Nk−8 of the multi-stage shifter 26, i.e., the output of the eighth stage shift unit 26h is selected. The eighth shift data Nk−8 has the compression rate of [1/256], as described above. Thus, the constant shift data Nj of [46464] corresponding to the input data at the level of −6 dB is compressed by the compression rate of [1/256]. The data compression is given by the equation.:

$$[46464] \times [1/256] = [181.5] \approx [181]$$

The compressed data of [181] is output from the output terminal 29 as a quotient Ni calculated by the division circuit. The quotient Ni of [181] is equivalent to the level of −3 dB to be compressed by the digital peak noise reduction circuit.

In the above embodiment of the division circuit, the ROM 30 stores the same expanded reciprocal related data in every address section. The expansion rates are different for every address section. Thus, the ROM 30 has a very high resolution in changing the divisor Na to the reciprocal related data Nf; even if the input signal Na is very low in level. On the other hand, the division circuit has the shifter 33 with different compression rates. Thus, the quotient obtained by the division circuit is compensated the data expansion in the reciprocal related data Na by the shifter 33.

Figure 8A:
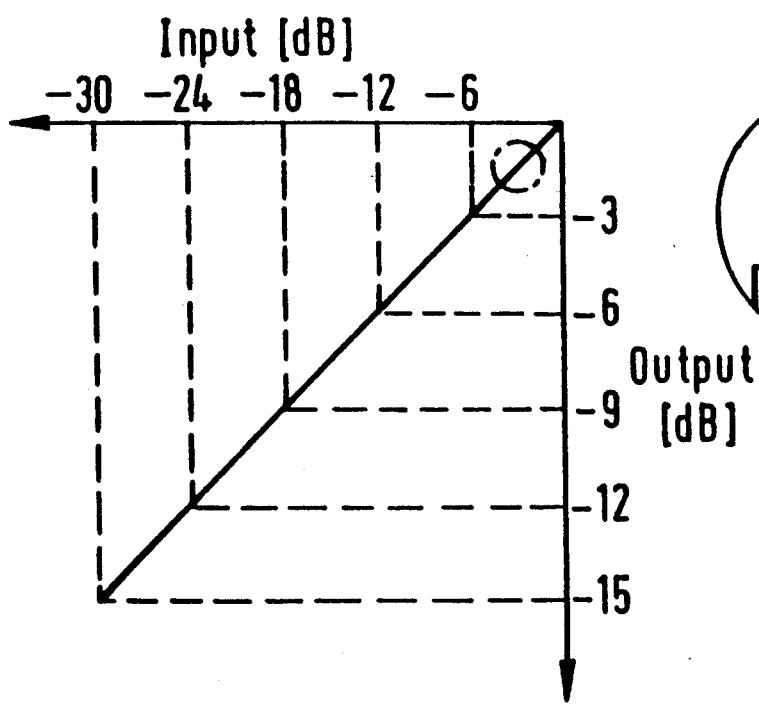
FIGS. 8(a) and 8(b) show data compression characteristics of the peak noise reduction circuit according to the present invention.
Figure 8B:
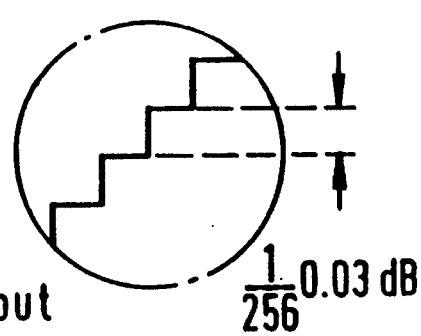

The data compression characteristics of the digital peak noise reduction circuit having the division circuit according to the present invention is shown in FIG. 8(a). A part of data compression characteristic graph in FIG. 8(a) is enlarged as shown in FIG. 8(b). As shown in FIGS. 8(a) and 8(b), the peak noise reduction circuit according to the present invention has a resolution of [1/256], which corresponds to the level resolution of 0.03 dB, for every level of the input signal.

As described above, the present invention can provide an extremely preferable digital peak noise reduction circuit.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A digital peak noise reduction circuit for reducing peak noise of an audio signal through processing of digital audio data corresponding to the audio signal, comprising:

division means for dividing the digital audio data by one of a plurality of divisors, including memory means responsive to one of said plurality of divisors for selectively supplying one of a plurality of reciprocal related data stored therein, the reciprocal related data corresponding to reciprocals of the plurality of divisors according to different expansion rates, each expansion rate corresponding to a different specific range of said plurality of divisors so that the reciprocal related data corresponding to each different specific range of divisors has the same expanded range, multiplication means for multiplying the digital audio data by the reciprocal related data output from the memory means, and multi-stage shift means responsive to said one of a plurality of divisors for selectively compressing the output data from the multiplication means by different compression rates, the compression rates corresponding to the expansion rates of the memory means so that the multi-stage shift means produces digital quotient data having a level compensated by an amount equal to the expansion rate selected in the memory means by the compression rate selected in the multi-stage shift means:

de-emphasis means coupled to the division means for compensating frequency characteristics of the digital quotient data produced by the division means; and feedback means coupled between the de-emphasis means and the division means for feeding back said one of a plurality of divisors in response to frequency compensated digital quotient data output from the de-emphasis means to the division means.

2. The circuit of claim 1 wherein the different expansion rates vary inversely to the reciprocal ranges.

3. The circuit of claim 2 wherein the memory means includes an ROM.

4. The circuit of claim 3 wherein the multi-stage shift means includes a plurality of shift output terminals and a selector for selecting one of the shift output terminals in response to said one of said divisors.

5. The circuit of claim 4 wherein the multi-stage shift means includes a plurality of shift devices coupled in series with each other, each output terminal of the shift devices being connected to the selector.

6. A division circuit for dividing a dividend by one of a plurality of divisors, comprising:

memory means responsive to said one of said plurality of divisors for selectively supplying one of a plurality of reciprocal related data stored therein, the reciprocal related data corresponding to reciprocals of said one of said divisors according to different expansion rates, each expansion rate corresponding to a different specific range of said plurality of divisors so that the reciprocal related data corresponding to each different specific range of said plurality of divisors has the same expanded range;

multiplication means for multiplying the dividend by the reciprocal related data output from the memory means; and multi-stage shift means responsive to said one of said plurality of divisors for selectively compressing the output data from the multiplication means by different compression rates, the compression rates corresponding to the expansion rates of the memory means so that the multi-stage shift means produces digital quotient data having a level compensated by an amount equal to the expansion rate selected in the memory means by the compression rate selected in the multi-stage shift means.

7. The circuit of claim 6 wherein the different expansion rates vary inversely to the reciprocal ranges.

8. The circuit of claim 7 wherein the memory means includes a ROM.

9. The circuit of claim 8 wherein the multi-stage shift means includes a plurality of shift output terminals and a selector for selecting one of the shift output terminals in response to said one of said plurality of divisors 10. The circuit of claim 9 wherein the multi-stage shift means includes a plurality of shift devices coupled in series with each other, each output terminal of the shift devices being connected to the selector.

* * * * *